United States Patent [19]
Saitou et al.

[11] Patent Number: 5,554,947
[45] Date of Patent: Sep. 10, 1996

[54] WAVE-SHAPING CIRCUIT WITH FEEDBACK CIRCUIT FOR ADJUSTING CENTRAL VOLTAGE LEVEL OF INPUT ALTERNATING SIGNAL

[75] Inventors: Mitsuhiro Saitou, Oobu; Hideki Kabune, Chiryu, both of Japan

[73] Assignee: Nippondenso Co., Ltd., Kariya, Japan

[21] Appl. No.: 319,549

[22] Filed: Oct. 7, 1994

[30] Foreign Application Priority Data

Oct. 8, 1993 [JP] Japan .................... 5-253040

[51] Int. Cl.⁶ .............. H03K 12/00; H03K 5/01; H03K 5/153
[52] U.S. Cl. ................... 327/184; 327/74; 327/165
[58] Field of Search ................... 327/184, 102, 327/104, 165–169, 74, 76, 295, 354

[56] References Cited

U.S. PATENT DOCUMENTS

| | | | |
|---|---|---|---|
| 4,011,507 | 3/1977 | Rossell | 327/76 |
| 4,090,154 | 5/1978 | Hauchart | 327/168 |
| 4,335,301 | 6/1982 | Palmer et al. | 327/165 |
| 4,613,973 | 9/1986 | Dahl | 327/184 |
| 4,764,685 | 8/1988 | Bleckmann et al. | 307/106 |

FOREIGN PATENT DOCUMENTS

| | | |
|---|---|---|
| 479176 | 4/1992 | European Pat. Off. . |
| 61-223572 | 10/1986 | Japan . |
| 62-135773 | 6/1987 | Japan . |
| 260330 | 5/1990 | Japan . |
| 3181067 | 8/1991 | Japan . |
| 57135 | 1/1993 | Japan . |

*Primary Examiner*—Toan Tran
*Attorney, Agent, or Firm*—Cushman Darby & Cushman, L.L.P.

[57] ABSTRACT

A wave-shaping circuit is provided which converts an input alternating signal into a pulse signal. The wave-shaping circuit includes a level-adjusting circuit which is designed to integrate the input alternating signal to determine a central level of amplitude thereof for adjusting the central level to a given reference level under feedback control. This compensates for the variation in central level of amplitude of the input alternating signal caused by various noise components contained therein.

7 Claims, 4 Drawing Sheets

WAVE-SHAPING CIRCUIT WITH FEEDBACK CIRCUIT FOR ADJUSTING CENTRAL VOLTAGE LEVEL OF INPUT ALTERNATING SIGNAL

BACKGROUND OF THE INVENTION

1. Technical Field of the Invention

The present invention relates generally to a wave-shaping circuit for converting an input alternating signal into a pulse signal, and more particularly to a wave-shaping circuit with a feedback circuit designed to compensate for variation in central voltage level of an input alternating signal.

2. Background Art

A wave-shaping circuit is usually used for processing an alternating signal produced according to rotation of a wheel of an automotive vehicle to determine a wheel speed. There has been proposed a wave-shaping circuit which converts through a pull-up resistor an alternating signal outputted from a speed sensor into another alternating signal varying across a given central voltage level and compares it with a preselected constant threshold level through a comparator to produce a pulse signal. However, when the center of amplitude of an output signal from the sensor varies due to some factor, the simple comparison, as discussed above, with the constant threshold level encounters a difficulty in that the input alternating signal is not wave-shaped precisely.

For avoiding the above drawback, Japanese Patent First Publication No. 62-135773 discloses an improved wave-shaping circuit, as shown in FIG. 6, which sets a threshold level of a comparator so as to follow the variation in central level of amplitude of an output signal from a sensor.

The wave-shaping circuit shown in FIG. 6 includes a first low-pass filter formed with a resistor 33 and a capacitor 34 for removing noise components contained in an input signal from a rotational speed sensor 32, a second low-pass filter having a resistor 35 and a capacitor 36 producing a reference signal for detecting a voltage level developed by a constant current supplied from a 5V constant current source 37, operational amplifiers 38 and 39 for changing the noise-removed signal and the reference signal in impedance, a threshold determining circuit built with constant current sources 42, 43 and resistors 40 and 41 for providing high and low threshold values for shaping the output from the operational amplifiers 38 and 39, comparators 44 and 45, and an R-S flip-flop 47 for producing a wave-shaped signal based on the high and low threshold values. The wave-shaping circuit further includes a comparator 46 which monitors the reference signal for detecting a circuit failure such as wire breakage of the rotational speed sensor 32 and provides a failure indicative signal from a terminal $f_{NG}$ to have an external device (not shown) indicate occurrence of the circuit failure.

In the above conventional wave-shaping circuit, an input signal from the rotational speed sensor 32 is adjusted by the current supplied from the constant current source and the activities of the resistor to lie over an in-phase input voltage range defined by the high and low threshold values, and the threshold values are modified so as to follow the variation in center of amplitude of the output signal from the rotational speed sensor 32. However, since the variation in voltage of the input signal may be developed due to variation in resistance value of the rotational speed sensor, a complex pulse-shaping circuit is needed. In other words, the conventional wave-shaping circuit requires the low-pass filter for producing the reference signal serving to detect a voltage level pulled up by the constant current source. Additionally, since the reference signal is unstable, the additional constant current sources 42 and 43 and the resistors 40 and 41 are also required for stability of the reference signal in order to determine the high and low threshold values based on the reference signal. Further, since these constant current sources and resistors generally have temperature-dependent characteristics, a temperature-compensating circuit is required which compensates for the variations in the characteristics caused by variation in ambient temperature.

SUMMARY OF THE INVENTION

It is therefore a principal object of the present invention to avoid the disadvantages of the prior art.

It is another object of the present invention to provide a wave-shaping circuit arrangement with a feedback circuit which is designed to compensate for variation in central level of amplitude of an input alternating signal to wave-shape the input alternating signal with high accuracy.

According to one aspect of the present invention, there is provided a wave-shaping apparatus which comprises a level adjusting circuit arranged to integrate an input alternating signal to determine a central level of amplitude of the input alternating signal for adjusting the central level to .a given reference level and a rectangular signal generating circuit arranged to compare the input alternating signal adjusted in central level by the level adjusting circuit with first and second threshold values to produce a rectangular signal.

In the preferred mode, the level adjusting circuit adds a signal having an opposite phase to cancel variation in the central level of amplitude of the input alternating signal and provides a dc bias thereto to bring the central level into agreement with the given reference level.

An integral time constant-changing circuit may further be provided which is designed to change an integral time constant for the input alternating signal according to frequency of the input alternating signal.

The integral time constant-changing circuit may alternatively change the integral time constant according to frequency of the rectangular signal.

The level adjusting circuit may add a dc bias to the input alternating signal. The dc bias is variably adjusted for bringing the central level of amplitude of the input alternating signal into agreement with the given reference level.

A malfunction-monitoring circuit may also be provided which monitors a current level outputted from the level adjusting circuit to detect a given circuit failure.

The malfunction-monitoring circuit provides a malfunction indicative signal when the current level outputted from the level adjusting circuit exceeds a preselected current detection value which is changed in response to the change in integral time constant through the integral time constant-changing circuit.

BRIEF DESCRIPTION OF THE DRAWINGS

The present invention will be understood more fully from the detailed description given hereinbelow and from the accompanying drawings of the preferred embodiment of the invention, which, however, should not be taken to limit the invention to the specific embodiment but are for the purpose of explanation and understanding only.

In the drawings.

DESCRIPTION OF THE PREFERRED EMBODIMENT

Figure 1:
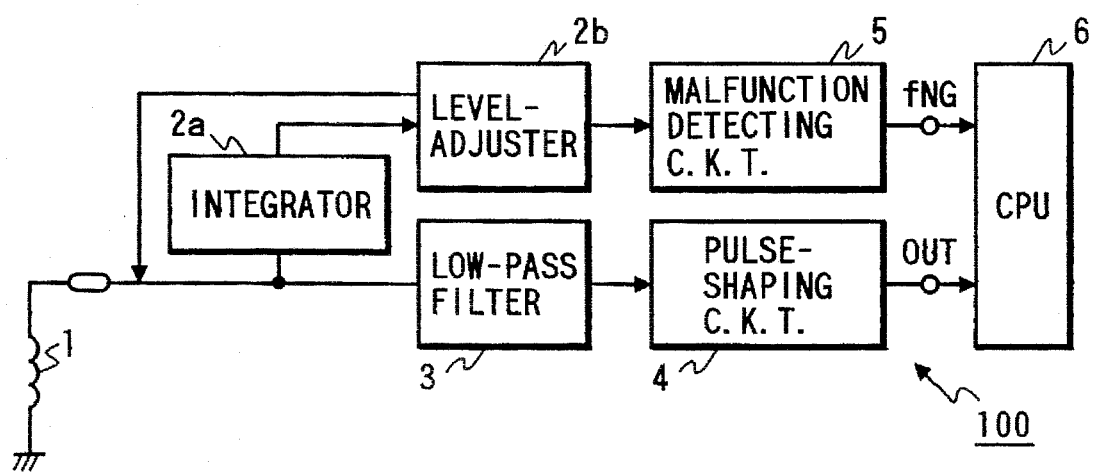
FIG. 1 is a circuit block diagram which shows a wave-shaping circuit according to the present invention.

Referring now to the drawings, wherein like numbers refer to like parts in several views, particularly to FIG. 1, there is shown a wave-shaping apparatus 100 according to the present invention which is suitable for converting an analog signal varying along substantially a sine wave into a pulse signal.

The shown wave-shaping apparatus 100 is designed to convert an input alternating signal produced from a rotational speed sensor 1 into a pulse signal, and includes generally an integrating circuit 2a, a level-adjusting circuit 2b, a low-pass filter 3, a pulse-shaping circuit 4, and a CPU 6.

The rotational speed sensor 1 may be built with a sensor rotor, having teeth formed thereon at regular intervals, connected to a wheel or a crankshaft of an engine of an automotive vehicle, for example, and an electromagnetic pickup which detects passage of the teeth of the sensor rotor according to rotation thereof to produce a speed signal having a frequency proportional to wheel speed. The speed signal takes the form of an alternating analog signal having a sine wave varying across a potential of the rotational speed sensor 1 (i.e., ground potential). An output voltage level of the speed signal is determined according to its frequency.

The integrating circuit 2a monitors the speed signal from the rotational speed sensor 1 to integrate it and produces an average level signal for modifying an input signal to the pulse-shaping circuit 4 so as to vary over an in-phase input voltage rage, as will be referred to hereinafter in detail. The level-adjusting circuit 2b feeds back an output signal from the integrating circuit 2a to have its central voltage level agree with a preselected reference voltage level. In practice, the level-adjusting circuit 2b adds a signal having an opposite phase to cancel the variation in central level of amplitude of the input signal from the rotational speed sensor 1 which has integrated by the integrating circuit 2a, and applies a preselected dc bias thereto to adjust the central level of amplitude of the input signal to the preselected reference voltage level. It is alternatively useful that a variably controlled bias voltage is applied to the rotational speed sensor 1 so as to adjust a level of am output signal from the rotational speed sensor 1 to a desired value.

Under the activities of the integrating circuit 2a and the level-adjusting circuit 2b, the output from the rotational speed sensor 1 is modified into a signal varying across the preselected reference voltage level.

The low-pass filter 3 takes in the output signal from the level-adjusting circuit 2 to remove therefrom frequency components higher than a specified value, and provides it to the pulse-shaping circuit 4. The pulse-shaping circuit 4 then sets high and low threshold values based on the preselected reference voltage level, and converts the high frequency component-removed signal from the low-pass filter 3 into a rectangular signal having a logic level (i.e., a pulse signal). The CPU takes in the rectangular signal from the pulse-shaping circuit 4 to determine a wheel speed of the automotive vehicle.

The level-adjusting circuit 2a may process any other signal as long as it is useful in modifying an input signal to the pulse-shaping circuit 4 into substantially the same signal as explained above. For example, an output signal from the low-pass filter 3 may be utilized.

The wave-shaping apparatus 100 further include a malfunction-monitoring circuit 5 which monitors a feedback output current produced from the level-adjusting circuit 2 to determine whether a malfunction such as a short-circuit or wire-breakage of the rotational speed sensor 1, has occurred or not. When some malfunction has occurred, the malfunction-monitoring circuit 5 provides a signal to the CPU 6 wherein a fail-safe operation is performed and a diagnostic signal is issued.

Figure 2A:
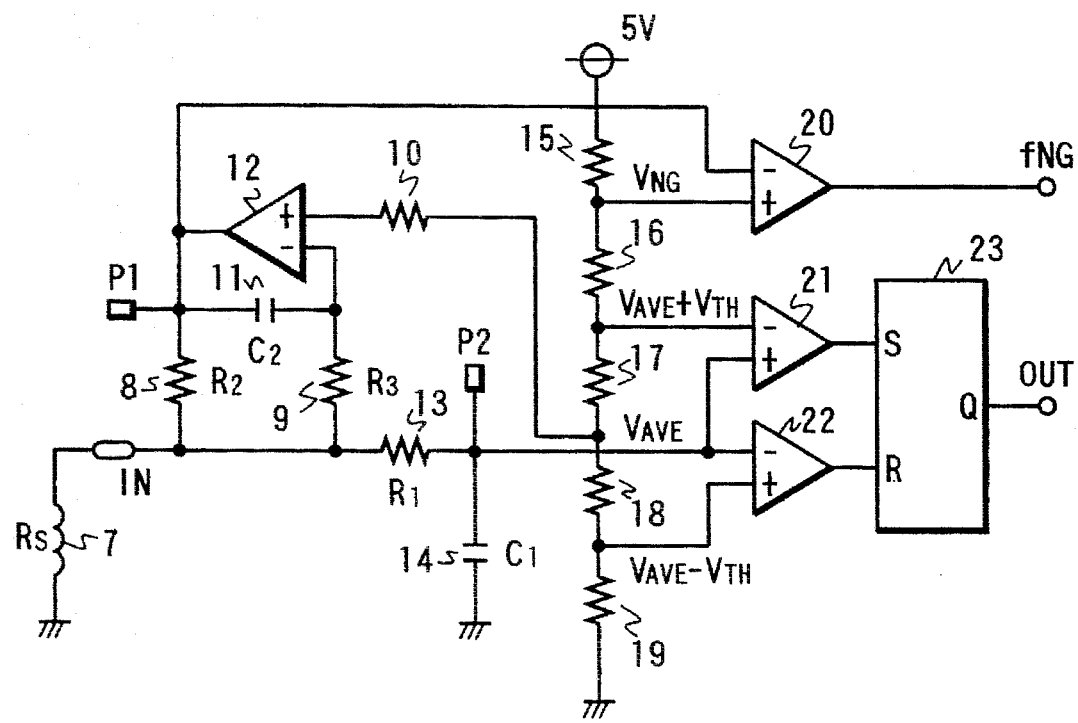
FIG. 2(a) is a circuit diagram which shows circuit arrangements of a wave-shaping circuit of the invention.

FIG. 2(a) shows, as an example, a circuit arrangement of the wave-shaping apparatus 100.

The integrating circuit 2a and the level-adjusting circuit 2b include an operational amplifier 12, resistors 8, 9, and 10, and a capacitor 11. The low-pass filter 3 includes a resistor 13 and a capacitor 14. The pulse-shaping circuit 4 includes resistors 15, 16, 17, 18, and 19, comparators 21 and 22, and an R-S flip-flop 23. The malfunction-monitoring circuit 5 includes a comparator 20.

In the thus-constructed wave-shaping circuit 100, the level-adjustment is accomplished by extracting an average level signal from an output signal of the rotational speed sensor 1 through the integrating circuit 2a having an integrating time constant $\tau_{c1}$ expressed by the equation (1) below to feed back the output from the integrating circuit 2a through the operational amplifier 12 of the level adjusting circuit 2b so as to bring the central level of amplitude of the output signal from the rotational speed sensor 1 into coincidence with the preselected reference voltage level $V_{ave}$.

$$\tau_{c1} = C_2 \left( R_2 + R_3 + R_2 \cdot \frac{R_3}{R_s} \right) \tag{1}$$

where $R_S$ denotes the impedance of the rotational speed sensor 1, $C_2$ and $C_1$ represent capacitances of the capacitors 11 and 14, and $R_2$, $R_3$, and $R_1$ represent resistances of the resistors 8, 9, and 13, respectively.

As a result of the above level-adjustment, the output from the rotational speed sensor 1 becomes a signal varying across the reference voltage level $V_{ave}$ which, in turn, is processed through the low-pass filter 3 having a cutoff frequency $f_{c2}$ given by the equation (2) below so that high-frequency noise components such as ignition noise and/or EMI (electromagnetic interference) are removed.

$$f_{c2} \approx 1/(2\pi \cdot R_1 \cdot C_1) \qquad (2)$$

The high-frequency noise component-removed signal from the low-pass filter 3 is then converted by the pulse-shaping circuit 4 into a rectangular signal having logic level which is, in turn, outputted to the CPU 6 for calculating a wheel speed of the automotive vehicle.

Threshold values of the comparators 21 and 22 are determined by the same circuit as that for providing the reference voltage level $V_{ave}$ of the level-adjusting circuit 2b, and are set to $V_{ave}+V_{TH}$ and $V_{ave}-V_{TH}$, respectively through a voltage divider network composed of the resistors 15, 16, 17, 18, and 19 (where the resistors 17 and 18 have the same resistance). With these arrangements, the pulse-shaping circuit 4 issues the rectangular signal having a duty cycle matching with the tooth accuracy of the sensor rotor of the rotational speed sensor 1.

The comparator 20 of the malfunction-monitoring circuit 5 monitors the feedback output from the level-adjusting circuit 2b, or the output from the operational amplifier 12 to detect a malfunction such as wire breakage of the rotational speed sensor 1.

Figure 3A:
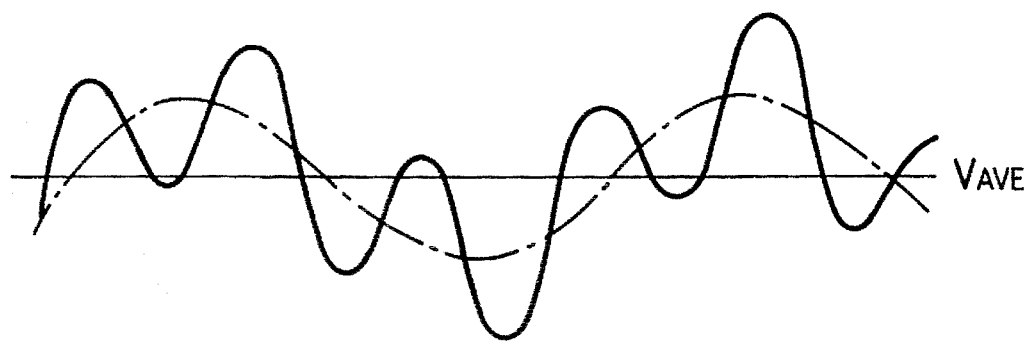
FIG. 3(a) is an illustration which shows the variation in central level of amplitude of an input alternating signal produced from a rotational speed sensor caused by vibration of a sensor rotor.

Usually, when a vehicle speed exceeds a preselected value, a shaft of the sensor rotor of the rotational speed sensor 1 may resonate the natural vibration of the automotive vehicle usually produced at 20 to 50 Hz. The resonance of the sensor rotor will produce a low-frequency noise causing the central level of amplitude of an output signal from the rotational speed sensor 1 to vary, as shown by a broken line in FIG. 3(a), across the reference voltage level $V_{ave}$.

Figure 2B:
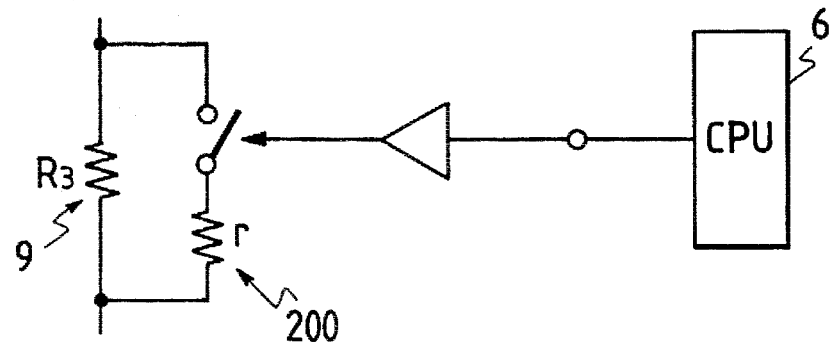
FIG. 2(b) is a circuit diagram which shows an integral time constant-switching circuit which may be used with the wave-shaping circuit shown in FIG. 2(a)

For eliminating the influence of the above low-frequency noise, an integral time constant-switching circuit 200 which, as shown in FIG. 2(b), includes a resistor r arranged in parallel to the resistor 9 ($R_3$) may be arranged in the integrating circuit 2a. The integral time constant-switching circuit 200 is designed to change the integral time constant according to the frequency of either an input signal from the rotational speed sensor 1 or a wave-shaped signal (i.e., a rectangular signal) to shorten a response time of the level-adjusting circuit 2b.

Figure 3B:
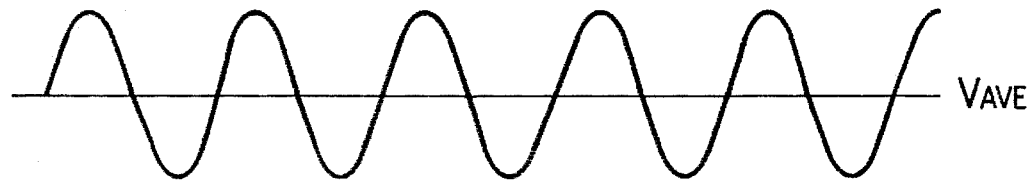
FIG. 3(b) is an illustration which shows an input alternating signal produced from a rotational speed sensor modified under activities of an integral time constant-switching circuit.

With the above circuit arrangement, the output signal from the rotational speed sensor 1 is shaped into one, as shown in FIG. 3(b), which has the wave center not varying across the reference voltage level $V_{ave}$ over a wide range of vehicle speed.

When a predetermined voltage level $V_{NG}$, as will be described hereinafter in detail, prodded for detection of a malfunction of the circuit is set to a constant level, the variation in waveform of a signal outputted from the rotational speed sensor 1 may cause the malfunction-detecting circuit 5 to mistakenly conclude that a circuit failure has occurred. This detection failure may, however, be overcome by changing the voltage level $V_{NG}$ in response to the switching of the integral time constant through the integral time constant-switching circuit 200 or prohibiting the waveform of the output signal from the rotational speed sensor 1 from being detected during the variation in waveform of the signal outputted from the rotational speed sensor.

Figure 4A:
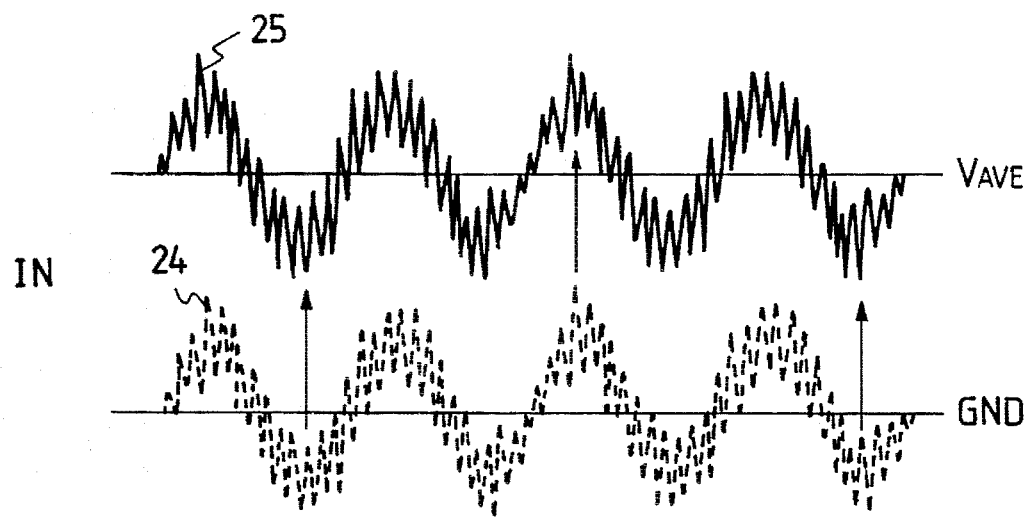
FIG. 4(a) shows waveforms of an input alternating signal produced from a rotational speed sensor before and after a feedback operation through a level-adjusting circuit 2b.
Figure 4B:
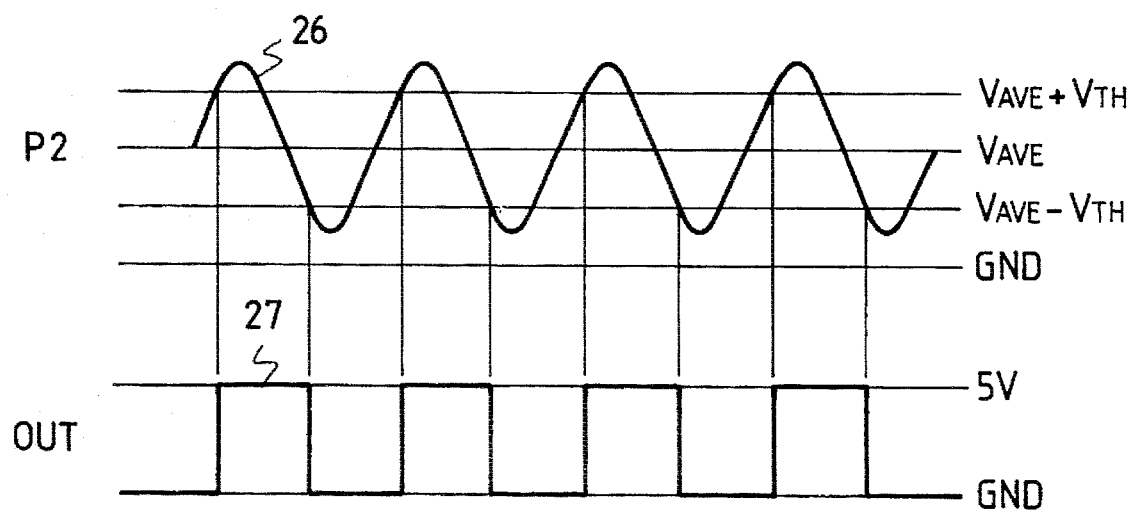
FIG. 4(b) shows waveforms of a signal feedback-adjusted by a level-adjusting circuit and a signal processed through a low-pass filter and a pulse-shaping circuit.

FIG. 4(a) shows waveforms of an output signal from the rotational speed sensor 1 before and after the feedback operation through the level-adjusting circuit 2b. FIG. 4(b) shows waveforms of a signal feedback-adjusted by the level-adjusting circuit 2b and a signal processed through the low-pass filter 3 and the pulse-shaping circuit 4.

A signal appearing at an input terminal IN, shown in FIG. 2(a), outputted from the rotational speed sensor 1 shows a waveform, as designated at reference numeral 24 in FIG. 4(a), varying across the GND potential. This signal is then feedback-adjusted by the level-adjusting circuit 2b so as to assume a waveform, as denoted at reference numeral 25, varying across the preselected reference voltage level $V_{ave}$. The waveform 25 thus shaped is inputted to the low-pass filter 3 to remove high-frequency noise components therefrom. The high-frequency noise component-removed signal outputted from the low-pass filter 3 exhibits substantially a sine wave, as denoted at reference numeral 26 in FIG. 4(b). This sine wave is then shaped by the R-S flip-flop 23 of the pulse-shaping circuit 4 according to the threshold values $V_{ave}+V_{TH}$ and $V_{ave}-V_{TH}$ lying in the in-phase input voltage range defined by the voltage division as stated above, into a rectangular signal, as represented at reference numeral 27, which is, in turn, outputted to the CPU 6.

Figure 5A:
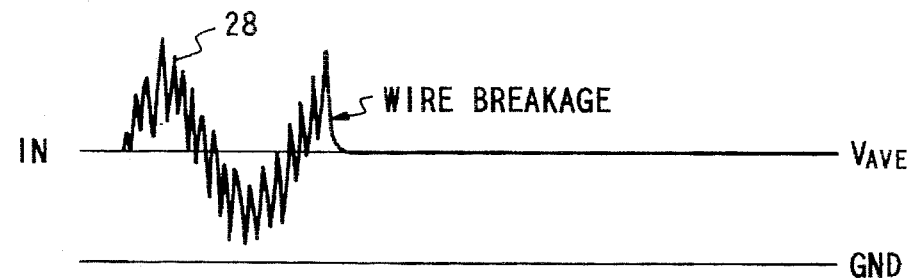
FIG. 5(a) shows a voltage level of an input alternating signal appearing at an input terminal IN when wire breakage of a rotational speed sensor has occurred.
Figure 5B:
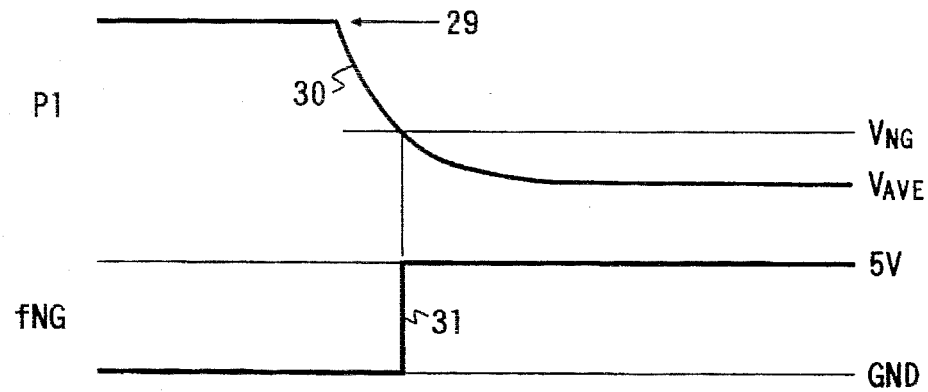
FIG. 5(b) shows voltage levels of a signal appearing at a portion P1 of a wave-shaping circuit and an output signal from a malfunction-monitoring circuit when wire breakage of a rotational speed sensor has occurred.
Figure 6:
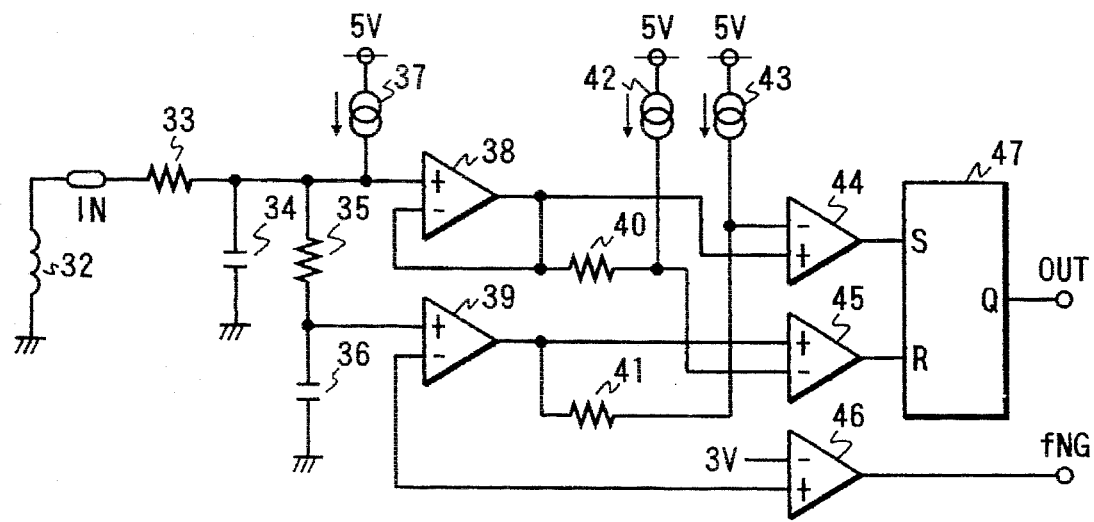
FIG. 6 is a circuit diagram which shows a conventional wave-shaping circuit.

FIGS. 5(a) and 5(b) show waveforms of signals appearing at specified portions of the circuit when the malfunction-detecting circuit 5 has detected a failure such as wire breakage of the rotational speed sensor 1.

A signal appearing at the input terminal IN outputted from the rotational speed sensor 1, as shown by reference numeral 28 in FIG. 5(a), disappears at the time the failure has occurred. This causes the impedance $R_S$ of the rotational speed sensor 1 to become infinite so that a voltage level 29 at a portion P1 shown in FIG. 2(a) is given by the following relation.

$$(R_S+R_2)/R_S \cdot V_{ave} \qquad (3)$$

Thus, the voltage of the signal appearing at the input terminal IN, as shown by reference numeral 30 in FIG. 5(b), drops to the reference voltage level $V_{ave}$. When it is decreased below the voltage level $V_{NG}$, it will cause the comparator 20 to elevate its output signal level, as shown by reference numeral 31, which is, in turn, sent to the CPU 6 through the terminal $f_{NG}$.

Additionally, when a GND short-circuit has occurred in the rotational speed sensor 1, the impedance $R_S$ becomes zero, thereby causing the voltage at the portion P1 to rise. Therefore, by monitoring this voltage rising, the short-circuit of the rotational speed sensor 1 can be detected. Note that the voltage appearing at the portion P1 are essentially equal to the output voltage from the operational amplifier 12 of the level-adjusting circuit 2b. Thus, the short-circuit of the rotational speed sensor 1 may alternatively be detected by measuring a variation in current outputted from the level adjusting circuit 2b.

With the above discussed circuit arrangement of the wave-shaping apparatus 100, the level-adjustment of adjusting the central level of amplitude of an input alternating signal from the rotational speed sensor 1 to the preselected reference voltage level $V_{ave}$ absorbs the variations in resistance of the rotational speed sensor 1 and/or ground potential to permits a fine signal having several tens of millivolt. Additionally, it allows the pulse-shaping circuit 4 to be composed of only a comparator. A sensor output having as much as a few hundreds of voltage can be handled without use of a special clamping circuit including a diode.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

What is claimed is:

1. A wave-shaping apparatus comprising:

a level adjusting circuit arranged to integrate an input alternating signal to determine a central level of amplitude of the input alternating signal for adjusting the central level to a given reference level; and a rectangular signal generating circuit arranged to compare the input alternating signal adjusted in central level by said level adjusting circuit with first and second threshold values to produce a rectangular signal.

2. A wave-shaping apparatus as set forth in claim 1, wherein said level adjusting circuit adds a signal having an opposite phase to cancel variation in the central level of amplitude of the input alternating signal and provides a dc bias thereto to bring the central level into agreement with the given reference level.

3. A wave-shaping apparatus as set forth in claim 1, the level adjusting circuit further comprising an integral time constant-changing circuit which is designed to change an integral time constant for the input alternating signal according to frequency of the input alternating signal.

4. A wave-shaping apparatus as set forth in claim 1, the level adjusting circuit further comprising an integral time constant-changing circuit which is designed to change an integral time constant for the input alternating signal according to frequency of the rectangular signal.

5. A wave-shaping apparatus as set forth in claim 1, wherein the level adjusting circuit adds a dc bias, to the input alternating signal, which is variably adjusted for bringing the central level of amplitude of the input alternating signal into agreement with the given reference level.

6. A wave-shaping apparatus as set forth in claim 1, further comprising a malfunction-monitoring circuit which monitors a current level outputted from said level adjusting circuit to detect a given circuit failure.

7. A wave-shaping apparatus as set forth in claim 3, further comprising a malfunction-monitoring circuit which provides a malfunction indicative signal when a current level outputted from said level adjusting circuit exceeds a preselected current detection value which is changed in response to the change in integral time constant through the integral time constant-changing circuit.

* * * * *